(12) United States Patent
Park et al.

(10) Patent No.: US 11,216,141 B2
(45) Date of Patent: Jan. 4, 2022

(54) TOUCH SENSOR AND DISPLAY DEVICE

(71) Applicant: Samsung Display Co., Ltd., Yongin-si (KR)

(72) Inventors: Jong Seon Park, Wonju-si (KR); Hwan Hee Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/844,905

(22) Filed: Apr. 9, 2020

(65) Prior Publication Data
US 2020/0326817 A1 Oct. 15, 2020

(30) Foreign Application Priority Data

Apr. 12, 2019 (KR) .................. 10-2019-0042992

(51) Int. Cl.
| | |
|---|---|
| *G06F 3/044* | (2006.01) |
| *G06F 3/041* | (2006.01) |
| *G06F 3/047* | (2006.01) |
| *H01L 27/32* | (2006.01) |
| *H01L 51/52* | (2006.01) |

(52) U.S. Cl.
CPC ............ *G06F 3/0448* (2019.05); *G06F 3/047* (2013.01); *G06F 3/0412* (2013.01); *G06F 3/0446* (2019.05); *H01L 27/323* (2013.01); *H01L 27/3246* (2013.01); *H01L 51/5237* (2013.01); *G06F 2203/04103* (2013.01); *G06F 2203/04105* (2013.01)

(58) Field of Classification Search
CPC .... G06F 3/0448; G06F 3/0446; G06F 3/0412; G06F 3/047; H01L 27/323; H01L 27/3246; H01L 51/5237

USPC .................................................. 345/156, 174
See application file for complete search history.

(56) References Cited

U.S. PATENT DOCUMENTS

| 9,791,964 B2 | 10/2017 | Kang et al. | |
|---|---|---|---|
| 10,459,560 B2 | 10/2019 | Kim et al. | |
| 2010/0128002 A1* | 5/2010 | Stacy | G06F 3/0445 345/174 |
| 2014/0098495 A1* | 4/2014 | Jeon | H05K 7/20136 361/695 |

(Continued)

FOREIGN PATENT DOCUMENTS

| KR | 10-2013-0003245 | 1/2013 |
|---|---|---|
| KR | 10-1727263 | 4/2017 |

*Primary Examiner* — Prabodh M Dharia
(74) *Attorney, Agent, or Firm* — H.C. Park & Associates, PLC

(57) ABSTRACT

A touch sensor includes a base layer, electrode units, and loop-shaped first lines. The electrode units are disposed on the base layer. The electrode units are arranged in a first direction and a second direction crossing the first direction. The loop-shaped first lines are in a same layer as the electrode units. The loop-shaped first lines are disposed between some of the electrode units, which are adjacent in the second direction. The loop-shaped first lines include resistance lines extending in the first direction and connection lines extending in the second direction. Some of the resistance lines, which are adjacent in the second direction, are connected by a connection line among the connection lines. The connection lines are spaced apart from each other in the first direction.

21 Claims, 17 Drawing Sheets

(56) References Cited

U.S. PATENT DOCUMENTS

| | | | |
|---|---|---|---|
| 2016/0034071 A1* | 2/2016 | Jee | G06F 3/017 |
| | | | 345/174 |
| 2016/0195955 A1* | 7/2016 | Picciotto | G06F 3/04144 |
| | | | 345/174 |
| 2016/0320879 A1* | 11/2016 | Hashida | G06F 3/0445 |
| 2017/0010719 A1* | 1/2017 | Chen | G06F 3/0445 |
| 2017/0220180 A1* | 8/2017 | Lu | G06F 3/04144 |
| 2017/0285799 A1* | 10/2017 | Iuchi | G06F 3/0446 |
| 2018/0053455 A1* | 2/2018 | Zhang | G09G 3/006 |
| 2018/0136760 A1* | 5/2018 | Lee | G06F 3/0443 |
| 2018/0180700 A1* | 6/2018 | Park | G01R 33/07 |

* cited by examiner

TOUCH SENSOR AND DISPLAY DEVICE

CROSS-REFERENCE TO RELATED APPLICATION

This application claims priority to and the benefit of Korean Patent Application No. 10-2019-0042992, filed Apr. 12, 2019, which is hereby incorporated by reference for all purposes as if fully set forth herein.

BACKGROUND

Field

Exemplary embodiments generally relate to a touch sensor and a display device.

Discussion

A display device for displaying an image may be used for various electronic appliances for providing an image to a user, such as smart phones, tablet personal computers (PCs), digital cameras, notebook computers, navigators, televisions, etc. The display device may include a display panel for generating and displaying an image and one or more input devices.

Some electronic appliances, e.g., smart phones and tablet PCs, may utilize a touch sensor for recognizing a touch input (or interaction) in association with a display device. It is also noted that a pressure sensor for detecting the intensity of pressure applied to a display device may be used in addition to or as a substitute for a physical button. The pressure sensor may be used in addition to the touch sensor for detecting a touch position or other aspect of touch.

Typically, each of the touch sensor and the pressure sensor includes a wiring pattern. The wiring pattern, which is generally made of a metal, may be visually recognized when pattern reflection occurs at the time of using a display device. When the wiring pattern is visually recognized on a display screen, display quality may deteriorate.

The above information disclosed in this section is only for understanding the background of the inventive concepts, and, therefore, may contain information that does not form prior art.

SUMMARY

Some aspects provide a thin film-type touch sensor capable of sensing a touch position and a touch pressure.

Some aspects are capable of providing a display device in which wiring structures of a touch sensor and a pressure sensor are configured to reduce the visibility of the wiring structures and/or a pattern thereof.

Additional aspects will be set forth in the detailed description which follows, and, in part, will be apparent from the disclosure, or may be learned by practice of the inventive concepts.

According to some exemplary embodiments, a touch sensor includes a base layer, electrode units, and loop-shaped first lines. The electrode units are disposed on the base layer. The electrode units are arranged in a first direction and a second direction crossing the first direction. The loop-shaped first lines are in a same layer as the electrode units. The loop-shaped first lines are disposed between some of the electrode units, which are adjacent in the second direction. The loop-shaped first lines include resistance lines extending in the first direction and connection lines extending in the second direction. Some of the resistance lines, which are adjacent in the second direction, are connected by a connection line among the connection lines. The connection lines are spaced apart from each other in the first direction.

According to some exemplary embodiments, a display device includes a pixel defining layer, a thin film encapsulation layer, electrode units, and a loop-shaped first line. The pixel defining layer includes openings corresponding to light emitting areas. Each light emitting area among the light emitting areas includes a first electrode, a light emitting layer, and a second electrode. The first electrode is at least partially exposed by an opening among the openings. The light emitting layer is disposed on the first electrode in the opening. The second electrode overlaps the first electrode. The light emitting layer is disposed between the second electrode and the first electrode. The thin film encapsulation layer is disposed on the pixel defining layer. The electrode units are disposed on the thin film encapsulation layer. The electrode units are arranged in a first direction and a second direction crossing the first direction. The loop-shaped first line is in a same layer as the electrode units. The loop-shaped first line is disposed between some of the electrode units, which are adjacent in the second direction. The loop-shaped first line includes resistance lines extending in the first direction and connection lines extending in the second direction. The resistance lines are connected together by the connection lines. The connection lines are spaced apart from each other in the first direction by a light emitting area among the light emitting areas.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
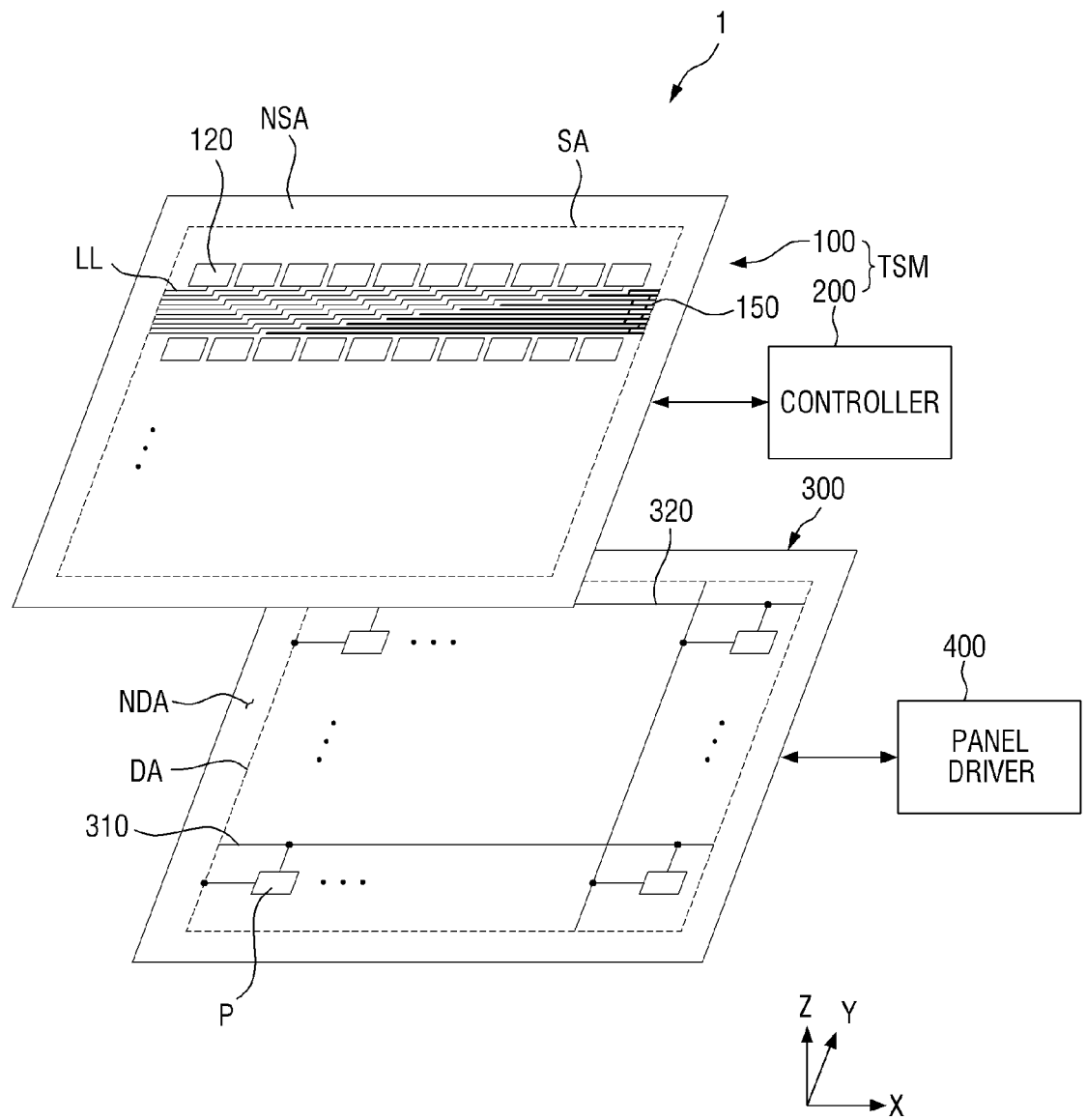
FIG. 1 is a schematic view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure. Spatially relative terms, such as "beneath," "below," "bottom," "under," "lower," "lower side," "lower surface," "above," "upper," "on," "over," "top," "higher," "upper side," "upper surface," "side" (e.g., as in "sidewall"), "left," "right," "upper," and "lower," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly. Generally, in this specification, the "on," "over," "top," "upper side," or "upper surface" refers to an upward direction, that is, a Z-axis direction, with respect to a display panel 300, and the "beneath," "under," "bottom," "lower side," or "lower surface" refers to a downward direction, that is, a direction opposite to the Z-axis direction, with respect to the display panel 300. Further, the "left," "right," "upper," and "lower" refer to directions when the display panel 300 is viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
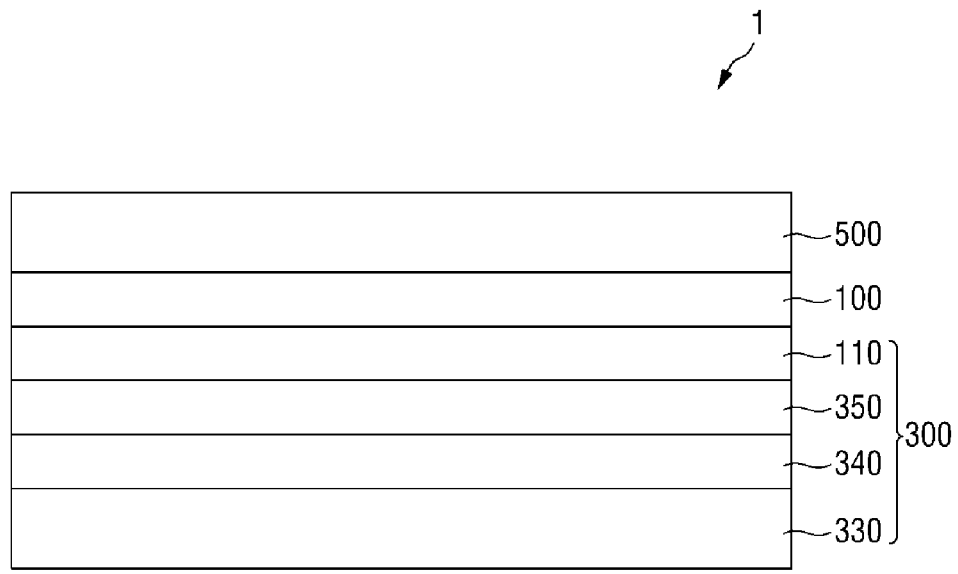
FIG. 2 is a schematic partial cross-sectional view of the display device shown in FIG. 1 according to some exemplary embodiments.
Figure 3:
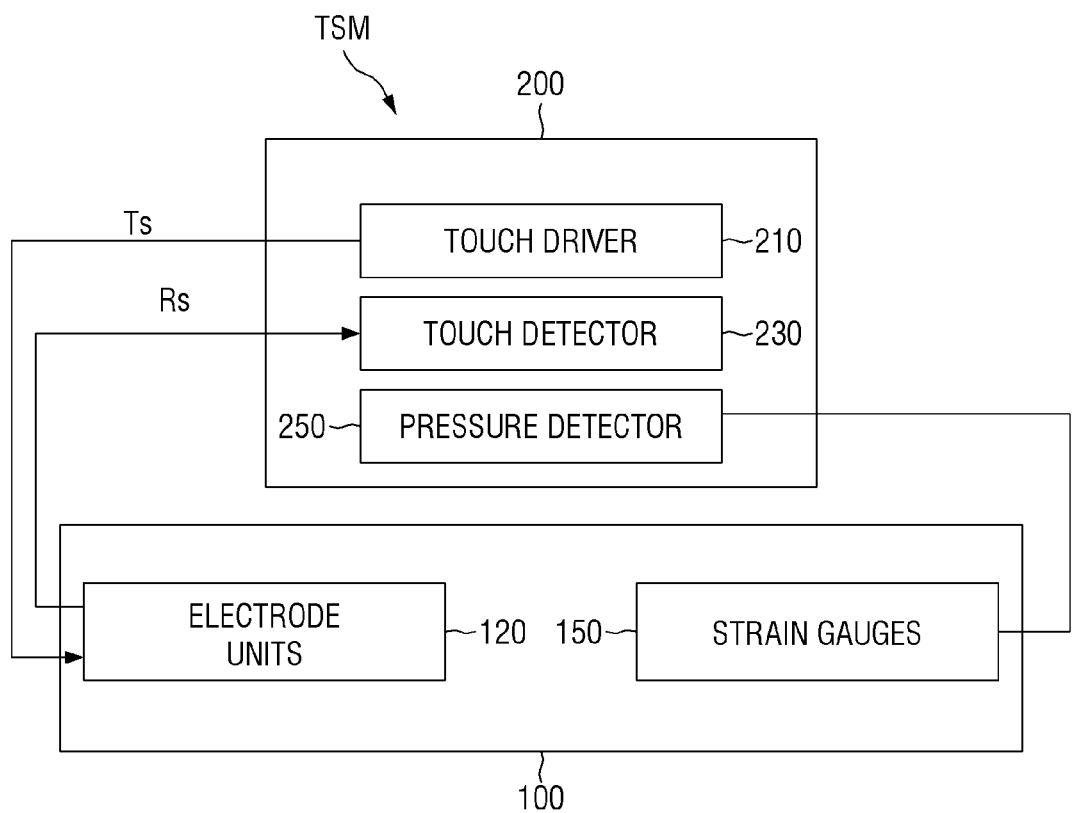
FIG. 3 is a block diagram of the touch sensor shown in FIG. 1 according to some exemplary embodiments.

FIG. 1 is a schematic view of a display device according to some exemplary embodiments. FIG. 2 is a schematic partial cross-sectional view of the display device shown in FIG. 1 according to some exemplary embodiments. FIG. 3 is a block diagram of the touch sensor shown in FIG. 1 according to some exemplary embodiments.

Referring to FIGS. 1 to 3, a display device 1 according to an embodiment may include a touch sensor TSM, the display panel 300, and a panel driver 400.

In some exemplary embodiments, the touch sensor TSM may include a sensor unit (or structure) 100 and a controller 200. Although it is shown in FIG. 1 that the sensor unit 100 and the display panel 300 are separated from each other, this is for convenience of explanation, and exemplary embodiments are not limited thereto. For example, the sensor unit 100 and the display panel 300 may be integrated with each other technically.

The display panel 300 includes a display area DA and a non-display area NDA outside the display area DA, such as surrounding at least a part of the display area DA. The display panel 300 may include a base substrate 330, a circuit driving layer 340 disposed on the base substrate 330, and a light emitting element 350 disposed on the circuit driving layer 340. The circuit driving layer 340 may include scan lines 310, data lines 320, and a plurality of thin film transistors (not illustrated) for driving the light emitting element 350. The display area DA of the circuit driving layer 340 may be provided with the scan lines 310 and the data lines 320 connected to the plurality of pixels P. Although not shown, the non-display area NDA of the circuit driving layer 340 may be provided with lines for supplying various driving signals and/or driving power for driving the pixels P.

The kind of the display panel 300 is not particularly limited. For example, the display panel 300 may be a self-luminous display panel, such as an organic light emitting diode display panel (OLED panel), a quantum dot light emitting diode display panel (QLED panel), a micro light emitting diode display panel, a nano light emitting diode display panel, etc. In some exemplary embodiments, the display panel 300 may be a non-luminous display panel, such as a liquid crystal display panel (LCD panel), an electro-phoretic display panel (EPD panel), an electro-wetting display panel (EWD panel), etc. When the display panel 300 is a non-luminous display panel, the display device may further include a light unit, e.g., a backlight unit, an edge light unit, etc., for supplying light to the display panel 300. Hereinafter, for convenience of explanation, a case where the display panel 300 is an organic light emitting diode display panel will be described as an example.

The panel driver 400 is electrically connected to the display panel 300 to supply signals for driving the display panel 300. For example, the panel driver 400 may include at least one of a scan driver supplying scan signals to the scan lines 310, a data driver supplying data signals to the data lines 320, and a timing controller driving the scan driver and the data driver. According to some embodiments, the scan driver, the data driver, and/or the timing controller may be integrated in one display integrated circuit (D-IC), but exemplary embodiments are not limited thereto. For example, in some embodiments, at least one of the scan driver, the data driver, and the timing controller may be integrated with one another and/or mounted on the display panel 300.

The sensor unit 100 may be provided on at least one area of the display panel 300. For example, the sensor unit 100 may be provided on at least one surface of the display panel 300 so as to overlap the display panel 300 in a third direction (or Z-axis direction), which is a thickness direction. For example, the sensor unit 100 may be disposed on a surface (for example, an upper surface) of the display panel 300 in a direction in which an image is emitted. In some exemplary embodiments, the sensor unit 100 may be formed (e.g., directly formed) on at least one or more surfaces (e.g., opposing surfaces) of the display panel 300, or may be formed inside (e.g., as a part of) the display panel 300. For example, the sensor unit 100 may be directly formed on an external surface of an upper substrate (e.g., thin film encapsulation layer) or a lower substrate (for example, an upper surface of an upper substrate or a lower surface of a lower substrate) of the display panel 300, or may be directly formed on an internal surface of an upper substrate or a lower substrate (for example, a lower surface of an upper substrate or an upper surface of a lower substrate) of the display panel 300. In some instances, the sensor unit 100 may be formed as part of the display panel 300 without the use of an adhesive layer that would otherwise couple the sensor unit 100 to the display panel 300.

The sensor unit 100 includes a sensing (or active) area SA capable of sensing a touch input and a peripheral area NSA outside, e.g., surrounding at least a part of the sensing area SA. According to some embodiments, the sensing area SA may be disposed to correspond to the display area DA of the display panel 300, and the peripheral area NSA may be disposed to correspond to the non-display area NDA of the display panel 300. For example, the sensing area SA of the sensor unit 100 may overlap the display area DA of the display panel 300 in the third direction (Z-axis direction), and the peripheral area NSA of the sensor unit 100 may overlap the non-display area NDA of the display panel 300 in the third direction (Z-axis direction).

As will become more apparent below, the sensing area SA of the sensor unit 100 may be provided with electrode units for detecting a touch input and strain gauges 150, which may include loop-shaped lines in some exemplary embodiments, for detecting a touch pressure.

The electrode units 120 may be arranged in a matrix formation. For instance, the electrode units 120 may be arranged in a first direction (X-axis direction) and a second direction (Y-axis direction) crossing (e.g., perpendicular) to the first direction (X-axis direction). The electrode units 120 may have a rectangular (or generally rectangular) shape, but the exemplary embodiments herein are not limited thereto. In some embodiments, the electrode units 120 may have various shapes, such as a polygonal (or generally polygonal) shape, a circular (or generally circular) shape, etc. In some embodiments, the electrode units 120 may have two or more shapes. For example, some of the electrode units 120 may have a rectangular shape, and others of the electrode units 120 may have a circular shape. Further, in some embodiments, the electrode units 120 may have different areas from each other. For example, when a hole for inserting a camera or the like is formed in the display device 1, the electrode units 120 around the hole may have a shape with a partially removed portion corresponding to a portion of the hole.

The electrode units 120 may be arranged in an island (or isolated) form in which individual electrode units 120 are spaced apart from each other along a first direction (X-axis direction) and a second direction (Y-axis direction) intersecting the first direction (X-axis direction). The electrode units 120 may form an electrode row in the first direction (X-axis direction), and may form an electrode column in the second direction (Y-axis direction).

The shape, size, and/or arrangement direction of the electrode units 120 are not particularly limited. For instance, in an exemplary embodiment, the electrode units 120 may be arranged as will be described later with reference to FIG. 4.

The electrode units 120 may be electrically connected to the controller 200 through second lines LL, and may receive driving signals Ts for touch detection from the controller 200. The electrode units 120 may output sensing signals Rs for touch detection to the controller 200 through the second lines LL.

The second lines LL may be disposed between adjacent electrode rows in the second direction (Y-axis direction). For example, the second lines LL may extend substantially in the first direction (X-axis direction), and one end of each of the second lines LL may be connected to respective ones of the electrode units 120. The second lines LL disposed in the first row may include a bending (or bent) portion connected to the electrode units 120 as will become more apparent below. Hereinafter, a single electrode unit of the electrode units 120 may be referred to using the same call reference number as a plurality of the electrode units 120, such as "a first electrode unit 120," "an i-th electrode unit 120," etc. The second lines LL formed in a next (e.g., lower) row may be bent along the shape of the second lines LL formed in a previous (e.g., upper) row. For instance, the second lines LL connected to the i-th electrode unit 120 among in a first row of electrode units 120 may include i+1 bent portions. The electrode units 120 may overlap at least one electrode of the display panel 300. For example, when the display panel 300 is an organic light emitting diode display panel, the electrode units 120 may overlap a common (e.g., cathode) electrode of the display panel 300.

First lines 150 may be disposed on (or in) the same layer as the electrode units 120, and may be disposed between adjacent electrode rows in the second direction (Y-axis direction). Hereinafter, the first lines 150 may be strain gauges. For example, the strain gauges 150 may extend generally in the first direction (X-axis direction). Hereinafter, a single strain gauge 150 may be referred to using the same call reference number as a plurality of the strain gauges 150, such as "the strain gauge 150," "first strain gauge 150," etc. The strain gauge 150 disposed in the first (or previous) row may extend up to the vicinity of the bent portion of the second line LL connected to the n-th electrode unit 120 among the electrode units 120 in the first row. The strain gauge 150 formed in the next (e.g., second) row may extend up to the vicinity of the bent portion of the second line LL connected to the (n-1)-th electrode unit 120 among of the previous (e.g., first) row electrode units 120. In this instance, the sum of lengths of the second lines LL disposed in (or associated with) the same row of the electrode units 120 may be equal to (or substantially equal to) the sum of lengths of the strain gauges 150 disposed in (or associated with) the same row of the electrode units 120.

When an external force is applied to the strain gauge 150, the length or cross-sectional area of the strain gauge 150 may be changed, and thus, the resistance value of the strain gauge 150 may be changed. The strain gauge 150 may be insulated from the electrode units 120. Although not shown in the drawings, the sensing area SA of the sensor unit 100 may further include a noise sensing electrode unit for sensing noise.

The controller 200 may include a touch driver 210, a touch detector 230, and a pressure detector 250. The controller 200 may be electrically connected to the sensor unit 100 to supply a driving signal Ts to the sensor unit 100 and receive a sensing signal Rs corresponding to the driving signal Ts from the sensor unit 100 to detect a touch position. For instance, the controller 200 may be electrically connected to the strain gauge 150 to detect a touch pressure.

The touch driver 210 may provide driving signals TS for detecting a touch input via the electrode units 120.

The touch detector 230 may receive sensing signals Rs corresponding to the driving signals Ts from the electrode units 120 to detect the presence and/or position of a touch input. For example, the electrode units 120 may form a first electrostatic capacitance with at least one electrode of the display panel 300. When a user's finger interacts with at least one of the electrode units 120, a second electrostatic capacitance is generated between the finger and the at least one of the electrode units 120, and the first electrostatic capacitance is changed by the second electrostatic capacitance. The value of the changed first electrostatic capacitance is transmitted to the touch detector 230 through the second lines LL connected to the electrode unit(s) 120 associated with the touch interaction. The touch detector 230 may check the sensing second lines LL receiving the value of the first electrostatic capacitance to detect a touch position. For example, the touch detector 230 may detect the amount of change in the self-capacitance formed in the electrode unit(s) 120 to detect a touch position.

The touch detector 230 may include at least one amplification circuit amplifying the received sensing signal Rs, an analog-to-digital converter connected to an output terminal of the amplification circuit, and a processor.

The pressure detector 250 may be electrically connected to the strain gauge 150 to detect a touch pressure based on the change in resistance of the strain gauge 150. The pressure detector 250 may include bridge circuits (or bridge circuit units), such as Wheatstone bridge circuits, electrically connected to the strain gauge 150, and the bridge circuit units may be provided in a number corresponding to the number of the strain gauges 150.

The touch driver 210, the touch detector 230, and the pressure detector 250 may be integrated in one touch IC, but exemplary embodiments are not limited thereto. In some embodiments, the touch driver 210 and the touch detector 230 may be integrated in one touch IC, and the pressure detector 250 may be located in an area other than the inside of the touch IC. For instance, the pressure detector 250 may be disposed on the display panel 300, or may be disposed on a separate flexible circuit board, but exemplary embodiments are not limited thereto.

A protective layer 500 may be disposed on the sensor unit 100. The protective layer 500 may include, for example, a window member. The protective layer 500 may be attached onto the sensor unit 100 by, for instance, an optically transparent adhesive, but exemplary embodiments are not limited thereto.

Although not shown, the display device 1 may further include an optical member. For example, an optical member, such as a polarizing film, may be interposed between the sensor unit 100 and the protective layer 500.

Hereinafter, the touch sensor TSM will be described in more detail with reference to FIGS. 4 to 11.

Figure 4:
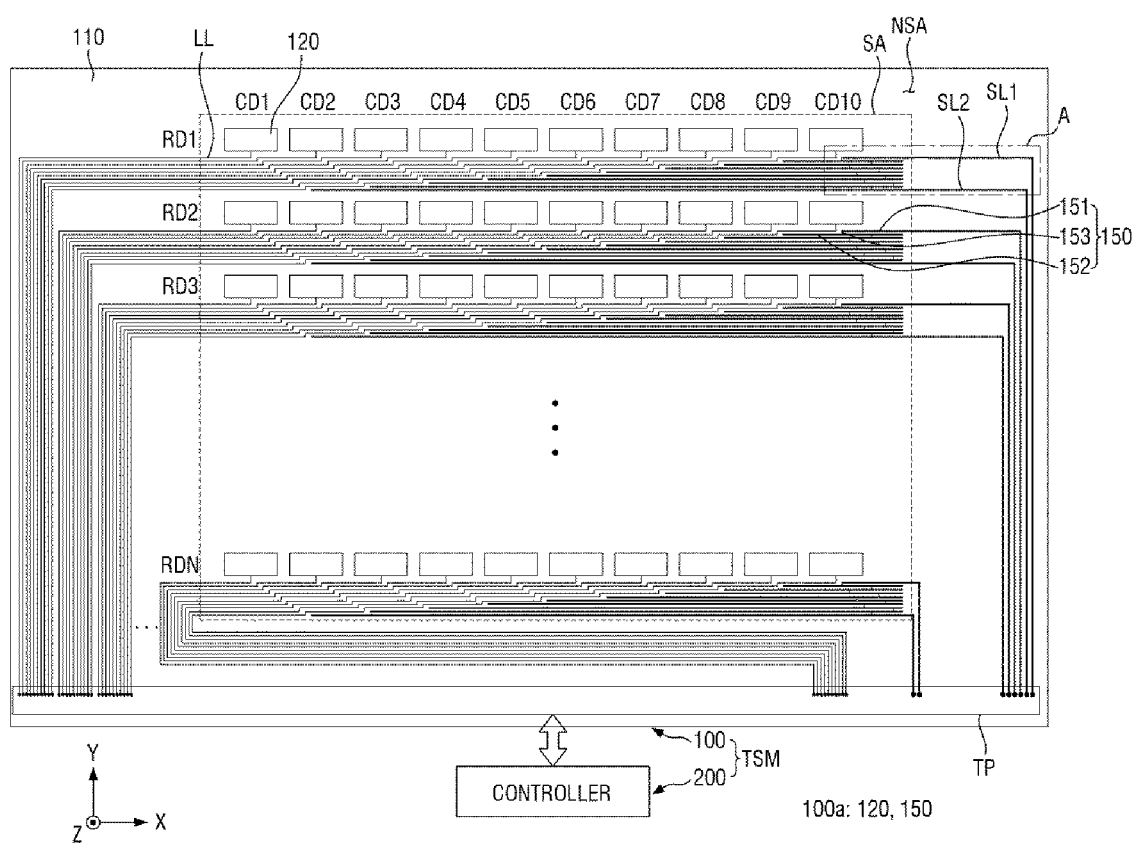
FIG. 4 is a plan view of a touch sensor according to some exemplary embodiments.
Figure 5A:
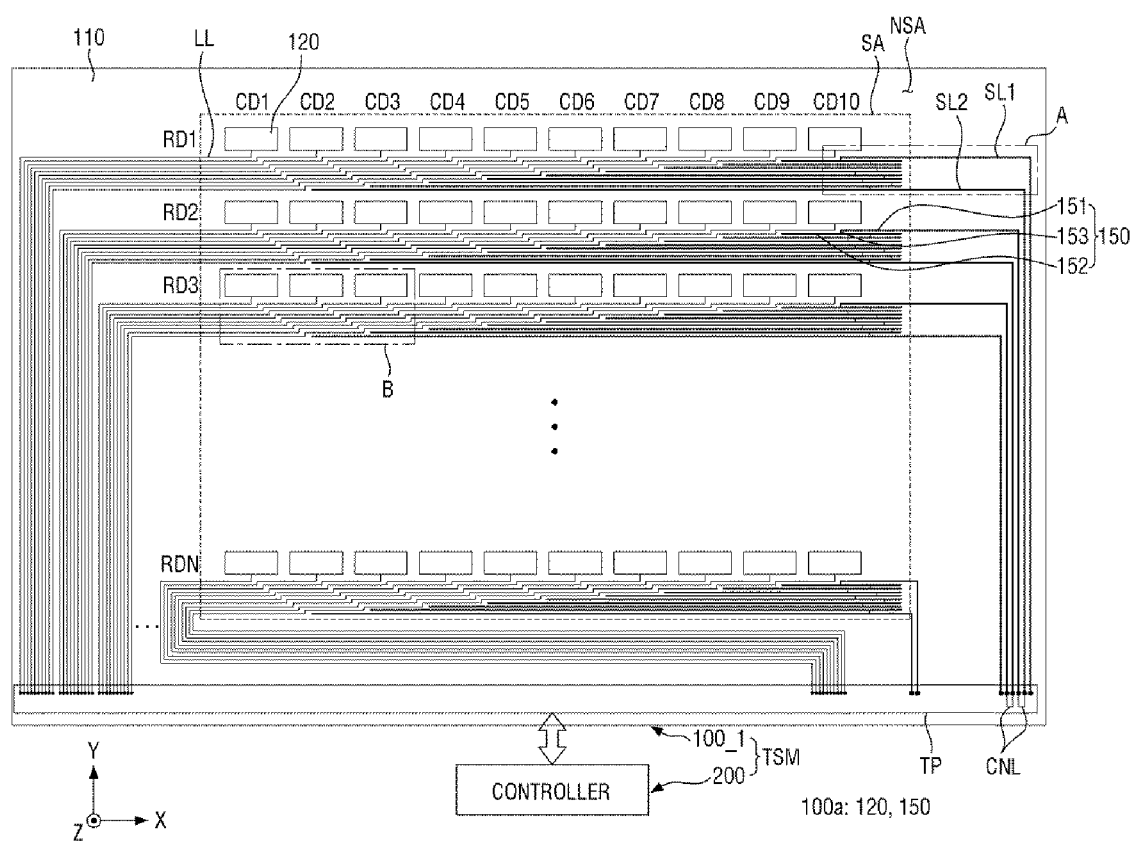
FIG. 5A is a plan view of a touch sensor according to some exemplary embodiments.
Figure 5B:
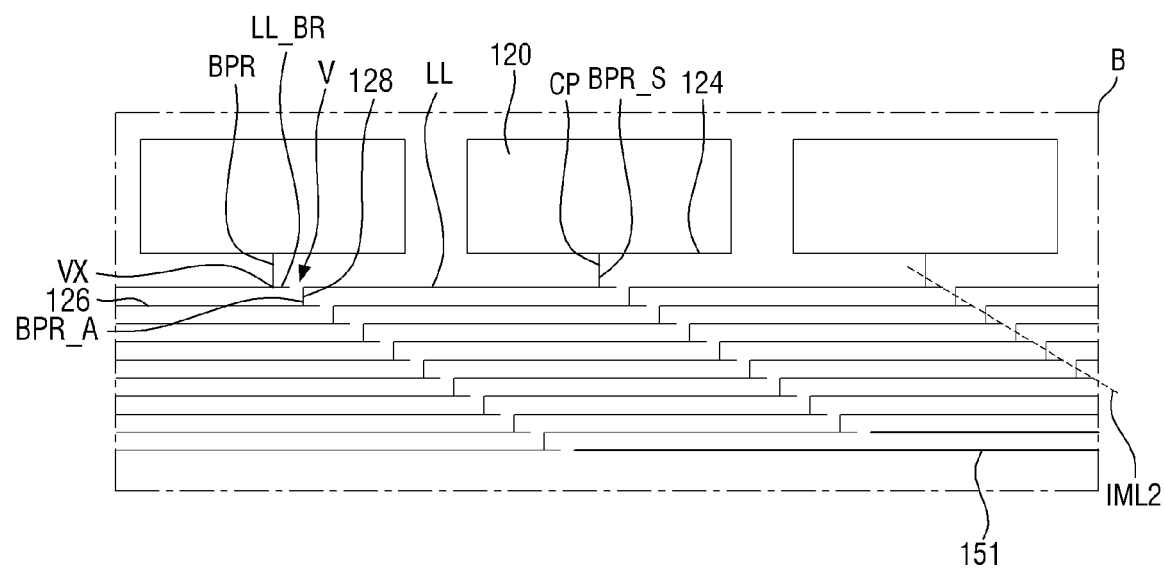
FIG. 5B is an enlarged plan view of portion B of FIG. 5A according to some exemplary embodiments.
Figure 6:
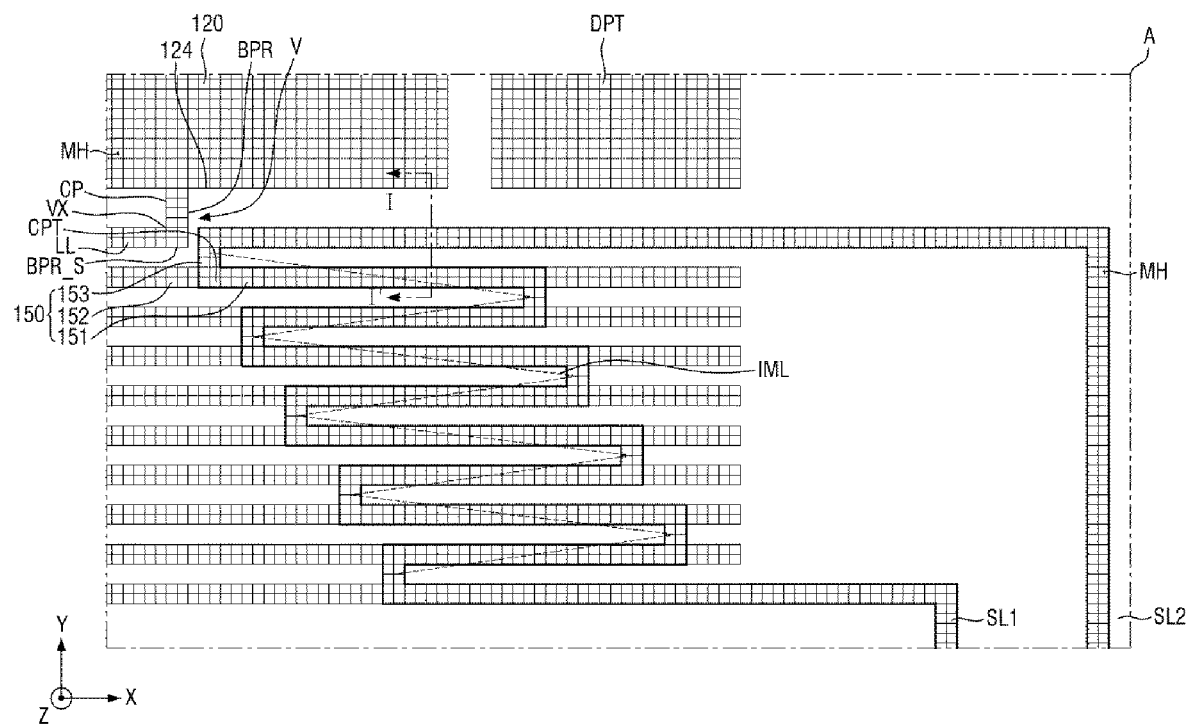
FIG. 6 is an enlarged plan view of portion A of FIG. 4 according to some exemplary embodiments.
Figure 7:
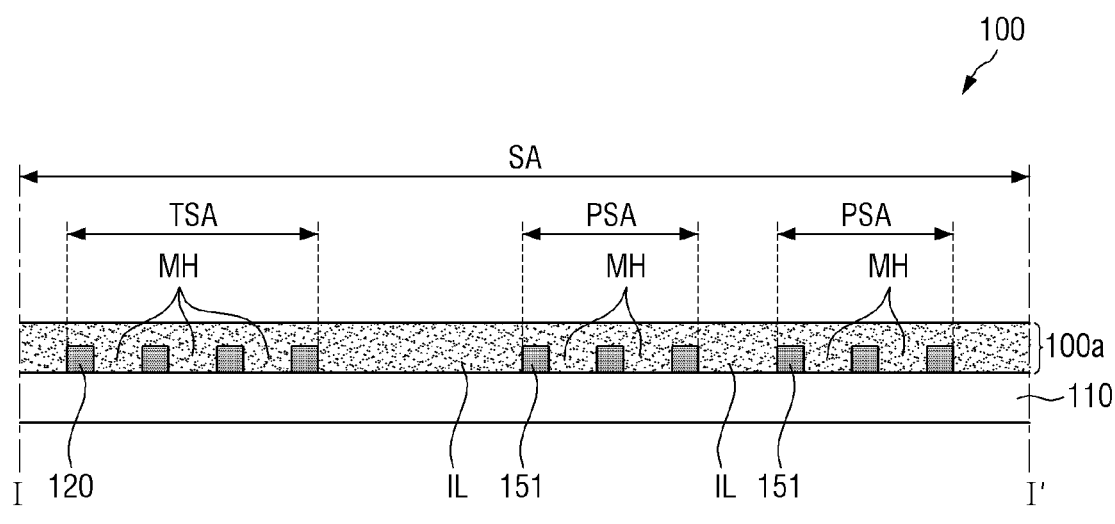
FIG. 7 is a cross-sectional view taken along sectional line I-I' of FIG. 6 according to some exemplary embodiments.

FIG. 4 is a plan view of a touch sensor according to some exemplary embodiments. FIG. 5A is a plan view of a touch sensor according to some exemplary embodiments. FIG. 5B is an enlarged plan view of portion B of FIG. 5A according to some exemplary embodiments. FIG. 6 is an enlarged plan view of portion A of FIG. 4 according to some exemplary embodiments. FIG. 7 is a cross-sectional view taken along sectional line I-I' of FIG. 6 according to some exemplary embodiments.

Referring to FIGS. 4 to 7, the touch sensor TSM includes a sensor unit 100 and a controller 200. Since the controller 200 has been described with reference to FIG. 3, a duplicate description will be omitted.

The sensor unit 100 includes a base layer 110 and a sensing pattern 100a disposed on the base layer 110. The sensing pattern 100a includes electrode units 120 and strain gauges 150.

The base layer 110 may include a sensing area SA and a peripheral area NSA. The base layer 110 is a layer serving as a base of the sensing pattern 100a. In some embodiments, the base layer 110 may be one of the layers constituting the display panel 300. For example, in some embodiments in which the sensor unit 100 and the display panel 300 are integrally formed, the base layer 110 may be at least one layer constituting the display panel 300. For instance, the base layer 110 may be a thin film encapsulation (TFE) layer of the display panel 300. In some embodiments, the base layer 110 may be a rigid substrate or a flexible substrate. For example, the base layer 110 may be a rigid substrate made of glass or reinforced glass, or a flexible substrate including a thin film made of, for instance, a plastic material. Hereinafter, a case where the base layer 110 includes at least one layer, for example, a thin film encapsulation layer constituting a portion of the display panel 300 will be described as an example.

The sensing area SA of the base layer 110 may be provided with electrode units 120 arranged on the base layer 110 in an island form, strain gauges 150 disposed between the electrode units 120 in the second direction (Y-axis direction), second lines LL electrically connected to the electrode units 120, and first and second signal lines SL1 and SL2 connected to the strain gauges 150.

As described above, the electrode units 120 may be arranged in an island form along rows and columns. Although it is shown in FIG. 4 that ten electrode units 120 are arranged along the first direction (X-axis direction) and N (N being an integer greater than zero) electrode units 120 are arranged along the second direction (Y-axis direction) with the electrode units 120 being sequentially arranged in a first electrode row RD1, a second electrode row RD2, a third electrode row RD3, and an N-th electrode row RDN along the second direction (Y-axis direction), and the electrode units 120 being sequentially arranged in first to tenth electrode columns CD1 to CD10 along the first direction (X-axis direction), this is merely an example for convenience of explanation, and exemplary embodiments are not limited thereto. For instance, the number and arrangement of the electrode units 120 may be variously changed.

The electrode units 120 may be disposed on the base layer 110, and may include a conductive material. For example, the conductive material may include a metal or an alloy thereof. Examples of the metal may include at least one of gold (Au), silver (Ag), aluminum (Al), molybdenum (Mo), chromium (Cr), titanium (Ti), nickel (Ni), neodymium (Nd), copper (Cu), and platinum (Pt). In some embodiments, the electrode units 120 may include a transparent conductive material. Examples of the transparent conductive material may include at least one of silver nanowires (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nanotubes, and graphene.

The electrode units 120 may have a single-layer structure or a multi-layer structure. When the electrode units 120 have a multi-layer structure, the electrode units 120 may include a plurality of metal layers. For example, the electrode units 120 may have a three-layer structure of titanium/aluminum/titanium.

Further, the electrode units 120 may have a mesh structure that transmits light output from the display area DA of the display panel 300. For example, the electrode units 120 may include a plurality of mesh holes MH, and a part of the base layer 110 may be exposed by the mesh holes MH. The mesh holes MH of the electrode units 120 may overlap the light emitting area of the display panel 300 in the third direction (Z-axis direction).

The area of the mesh holes MH may be larger than the area of the light emitting area of the display panel 300. For instance, the area of the mesh holes MH may be larger than the light emitting area of a pixel P of the display panel 300. Thus, even when the electrode units 120 are located on the display area DA of the display panel 300, since the electrode units 120 are provided with the mesh holes MH, light output from the display area DA of the display panel 300 may pass through the mesh holes MH of the electrode units 120 and be output to the outside.

The strain gauges 150 may be arranged on the sensing area SA of the base layer 110, and may be arranged on (or in) the same layer as the electrode units 120. The strain gauges 150 may not overlap the electrode units 120 in the third direction (Z-axis direction). However, exemplary embodiments are not limited thereto, and in some embodiments, the strain gauges 150 and the electrode units 120 may partially overlap each other in the third direction (Z-axis direction).

Strain gauges 150 may include resistance lines 151 and connection lines 153. The resistance lines 151 may be disposed between the rows of electrode units 120 in the second direction (Y-axis direction) and may be spaced apart from the electrode units 120. The resistance lines 151 may be formed in a loop shape in which the resistance lines 151 are connected to the connection lines 153 to constitute one closed path. For example, ten resistance lines 151 may be disposed between the first electrode row RD1 and the second electrode row RD2. The resistance lines 151 may extend substantially in the first direction (X-axis direction). The resistance line 151 disposed in the first row of the resistance lines 151 associated with the first electrode row RD1 may extend to the vicinity V of the bent portion BPR of the second line LL connected to the electrode unit 120 located in the first electrode row RD1 and the tenth electrode column CD10. The resistance line 151 disposed in the second row of the resistance lines 151 associated with the first electrode row RD1 may extend to the vicinity of the bent portion BPR of the second line LL connected to the electrode unit 120 located in the first electrode row RD1 and the ninth electrode column CD9. Consequently, the sum of lengths of the second lines LL disposed in (or associated with) the same row of electrode units 120 may be equal to the sum of lengths of the resistance lines 151 disposed in (or associated) the same row of the electrode units 120.

When a pressure having a predetermined intensity is applied to the sensor unit 100 of the touch sensor TSM, the length and/or cross-sectional area of the resistance line 151 is deformed, and the resistance value of the resistance line 151 is changed according to the deformation of the length and/or cross-sectional area of the resistance line 151. As such, the intensity of a touch pressure may be determined based on the changed resistance value.

The resistance lines 151 may be arranged on (or in) the same layer as the electrode units 120, and the resistance lines 151 may include the same material as the electrode units 120. For example, the resistance lines 151 may include a conductive material. The resistance lines 151 may be formed in the same process(es) as the electrode units 120, and the resistance lines 151, like the electrode units 120, may have a mesh structure. For example, the resistance lines 151 may include a plurality of mesh holes MH, and a part of the base layer 110 may be exposed by the mesh holes MH of the resistance lines 151. The mesh holes MH of the resistance lines 151 may overlap the light emitting area of the display panel 300 in the third direction (Z-axis direction), which is a thickness direction. The area of the mesh holes MH of the resistance lines 151 may be greater than the area of the light emitting area of the display panel 300, e.g., greater than the area of the light emitting area of a pixel P of the display panel 300. Thus, even when the resistance lines 151 are located on the display area DA of the display panel 300, light output from the display area DA of the display panel 300 can pass through the resistance lines 151 and be output to the outside.

In some embodiments, the resistance lines 151 may be formed by removing a part of the mesh structure. For example, when the resistance lines 151 are formed by removing a part of the mesh structure, a plurality of branches 152 spaced apart from each other may be formed. The branches 152 may be a remainder of the resistance lines 151 remaining after removing a part of the mesh structure.

In some embodiments, a dummy pattern DPT may be disposed in an area where the resistance lines 151, the branches 152, the connection lines 153, the electrode units 120, and the second lines LL are not arranged. The dummy pattern DPT may be a remainder remaining after removing a part of the mesh structure. In some exemplary embodiments, the dummy pattern DPT may be disposed on the same layer as the strain gauges 150, the electrode units 120, and the second lines LL, and may be spaced apart from the strain gauges 150, the electrode units 120, and the second lines LL. Such a dummy pattern DPT can prevent (or at least mitigate) the deterioration of image quality due to the visibility of an area where the strain gauges 150, the electrode units 120, and the second lines LL are not disposed in the display area DA.

Referring to FIGS. 4, 5A and 5B, the second lines LL may have a bent portion BPR in the vicinity V of an end 124 of the electrode unit 120 disposed in the first row. The second lines LL disposed in the next row may have an adjacent bent portion BPR_A adjacent to the bent portion BPR of the second lines LL disposed above. In this manner, the second lines LL may be bent in correspondence with one another. Consequently, the plurality of bent portions BPRs may form an oblique pattern extending in one direction between the first direction (X-axis direction) and the second direction (Y-axis direction). In this case, when the distance between the bent portions BPRs is short, the pattern may be viewed from a side of a display screen. Therefore, it is possible to prevent (or at least reduce) pattern visibility by increasing the distance between the bent portions BPRs.

However, when the distance between the bent portions BPRs is increased, the pattern may be viewed due to the difference between the section in which the second lines LL are arranged and the section in which the second lines LL is not arranged. To prevent (or at least reduce) such a pattern visibility phenomenon, in some exemplary embodiments, a branch LL_BR extending from a vertex VX of the bent portion BPR in the first direction (X-axis direction) may be provided at the vicinity V of the bent portion BPR of the adjacent second lines LL. At least because the second lines LL, similarly to the resistance lines 151, may be formed by removing a part of the mesh structure, branches LL_BR spaced apart from each other may be formed when the second lines LL are formed by removing a part of the mesh structure.

In some exemplary embodiments, each of the second lines LL may have at least one first portion 126 and at least one second portion 128. Second imaginary lines, such as second imaginary line IML2, may extend through respective groups of the second portions 128 of the second lines LL with the second imaginary lines being adjacent to one another in the first direction (X direction). The second imaginary lines, such as the second imaginary line IML2, may extend in a fourth direction crossing each of the first direction (X direction) and the second direction (Y direction).

The connection lines 153 may electrically connect the resistance lines 151 arranged along the second direction (Y-axis direction) from each other. For example, the resistance lines 151 arranged along the second direction (Y-axis direction) may be connected to each other by one connection line 153 extending in the second direction (Y-axis direction). However, when the connection line 153 crosses ten resistance lines 151 arranged along the second direction (Y-axis direction), a peripheral area and a step may occur along the connection line 153. Such a step may affect the visibility of a specific pattern from a side of the display screen by making the reflectance or reflection angle (e.g., emission direction of reflected light) different for incident light. In some exemplary embodiments, to prevent such a pattern visibility phenomenon, two resistance lines 151 adjacent to each other in the second direction (Y-axis direction) of the plurality of resistance lines 151 may be connected by any one of the plurality of connection lines 153, and the plurality of connection lines 153 may be spaced apart from each other in the first direction (X-axis direction). Although it is shown in FIG. 4 that ten resistance lines 151 extending in the first direction (X-axis direction) and nine connection lines extending in the second direction (Y-axis direction) are arranged in a zigzag pattern, this is merely an example, and exemplary embodiments are not limited thereto. For example, referring to FIG. 6, an imaginary line IML, connecting the centers of the connection lines 153 may extend in an oblique direction that is one direction between the first direction (X-axis direction) and the second direction (Y-axis direction).

The connection lines 153 may be in direct contact with the resistance lines 151, and the connection lines 153 may be spaced apart from the electrode units 120 without contacting the electrode units 120.

The connection lines 153 may be arranged on the same layer as the resistance lines 151 and the electrode units 120, and the connection lines 153 may include the same material as the resistance lines 153 and the electrode units 120. For example, the connection lines 153 may include a conductive material. The connection lines 153 may be formed in the same process as the resistance lines 151 and the electrode units 120, and the connection lines 153, like the resistance lines 151 and the electrode units 120, may have a mesh structure.

An insulating layer IL may be disposed on the electrode units 120, the connection lines 153, and the resistance lines 151. For example, the insulating layer IL may cover the electrode units 120, the connection lines 153, and the resistance lines 151. For instance, the insulating layer IL may contact the electrode units 120, the connecting lines 153, the resistance lines 151, and the base layer 110, and the mesh holes respectively provided in the electrode units 120, the connection lines 153, and the resistance lines 151 may be filled with an insulating material constituting the insulating layer IL. The electrode units 120 and strain gauges 150 disposed (or arranged) on the same layer may be insulated from each other by the insulating layer IL.

The insulating layer IL may include an insulating material. In some embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin.

The sensor unit 100 may include second lines LL and first and second signal lines SL1 and SL2. For example, the sensor unit 100 may include second lines LL connected to the electrode units 120, and a first signal line SL1 and a second signal line SL2 connected to the resistance lines 151.

First ends of the second lines LL may be connected to electrode units 120, and the number of the second lines LL may be equal to the number of the electrode units 120. For example, when "n" electrode units 120 are arranged in the first direction (X-axis direction), "n" second lines LL may be arranged corresponding to "n" electrode units 120, and when "m" first electrode row RD1 in which "n" electrode units 120 are arranged in the first direction (X-axis direction) are arranged in the second direction (Y-axis direction), "n"×"m" second lines LL may be arranged. Second ends of the "n×m" second lines LL may be connected to a pad unit TP. However, the exemplary embodiments are not limited thereto, and in some embodiments, when the plurality of the electrode units 120 constitute electrode groups, one second line LL may be connected to one electrode group. For instance, the number of the second lines LL may be smaller than the number of the electrode units.

A first end of the first signal line SL1 may be connected to a first end of the strain gauge 150, and a second end of the second signal line SL2 may be connected to a second end of the strain gauge 150. For instance, as shown in FIG. 4, when the connection line 153 of the strain gauge 150 electrically connects one end of the ten resistance lines 151 arranged along the second direction (Y-axis direction) to each other, the first signal line SL1 may be connected to the other end of the first resistance line 151 disposed in the second direction (Y-axis direction), and the second signal line SL2 may be connected to the other end of the tenth resistance line 151. For instance, the other ends of the first signal line SL1 and the second signal line SL2 may be connected to the pad unit TP.

The second lines LL and the signal lines SL1 and SL2 may be disposed (or arranged) on the same layer as the electrode units 120, the connection lines 153, and the resistance lines 151, and the second lines LL and the first and second signal lines SL1 and SL2 may include the same material as the electrode units 120, the connection lines 153, and the resistance lines 151. For example, the second lines LL and the first and second signal lines SL1 and SL2 may include a conductive material. The second lines LL and the first and second signal lines SL1 and SL2 may be formed in the same process as the electrode units 120, the connection lines 153, and the resistance lines 151, and may have a mesh structure.

The pad unit TP may include a plurality of pads arranged along the first direction x, and the second lines LL and the first and second signal lines SL1 and SL2 may be connected to the respective pads. As shown in FIG. 4, the pad unit TP of the sensor unit 100 may include a signal line connection pattern CNL that electrically connects adjacent strain gauges 150 to each other. In this case, the strain gauge 150 disposed in the first electrode row RD1, the strain gauge 150 disposed in the second electrode row RD2, and the strain gauge 150 disposed in the third electrode row RD3, as independent pressure sensors, may detect pressure.

However, exemplary embodiments are not limited thereto. As shown in FIG. 5A, the pad unit TP of the sensor unit 100_1 may include a signal line connection pattern CNL that electrically connects the adjacent strain gauges 150 to each other. For example, the signal line connection pattern CNL may electrically connect the second signal line SL2 of the strain gauge 150 disposed in the first electrode row RD1 to the first signal line SL1 of the strain gauge 150 disposed in the second electrode row RD2, and may electrically connect the second signal line SL2 of the strain gauge 150 disposed in the second electrode row RD2 to the first signal line SL1 of the strain gauge 150 disposed in the third electrode row RD3. In this case, the strain gauge 150 disposed in the first electrode column CD1, the strain gauge 150 disposed in the second electrode column CD2, and the strain gauge 150 disposed in the third electrode column CD3, as one pressure sensor, may detect pressure.

As described above, the strain gauges 150 may be grouped through the signal line connection pattern CNL, and the arrangement of the signal line connection pattern CNL may be variously modified.

The touch sensor TSM according to some exemplary embodiments may be advantageous in that the electrode units 120, the strain gauges 150, the second lines LL, and the first and second signal lines SL1 and SL2 can be simultaneously formed through one mask process because the electrode units 120, the strain gauges 150, the second lines LL, and the first and second signal lines SL1 and SL2 may be all disposed (or arranged) on the same layer in the sensing area SA. For instance, the manufacturing process of the display device 1 may be simplified to effectively improve productivity and realize the touch sensor TSM in a thin film shape.

Meanwhile, according to some exemplary embodiments, the base layer 110, serving as a base of the sensor unit 100, may be a thin film encapsulation (TFE) layer of an organic light emitting diode display panel. In this case, the base layer 110 may be embodied as a multilayer structure including at least one organic film and at least one inorganic film, or may be embodied as a single layer structure including a combination of organic and inorganic materials. For example, the base layer 110 may be formed as multiple layers including at least two inorganic films and at least one organic film interposed between the inorganic films. As described above, in the display device in which the base layer 110 is realized as a thin film encapsulation layer of the organic light emitting diode display panel, the components of the display panel 300 may be disposed on one surface of the base layer 110, and the electrodes constituting the sensor unit 100 may be disposed on the other surface of the base layer 110.

Figure 8:
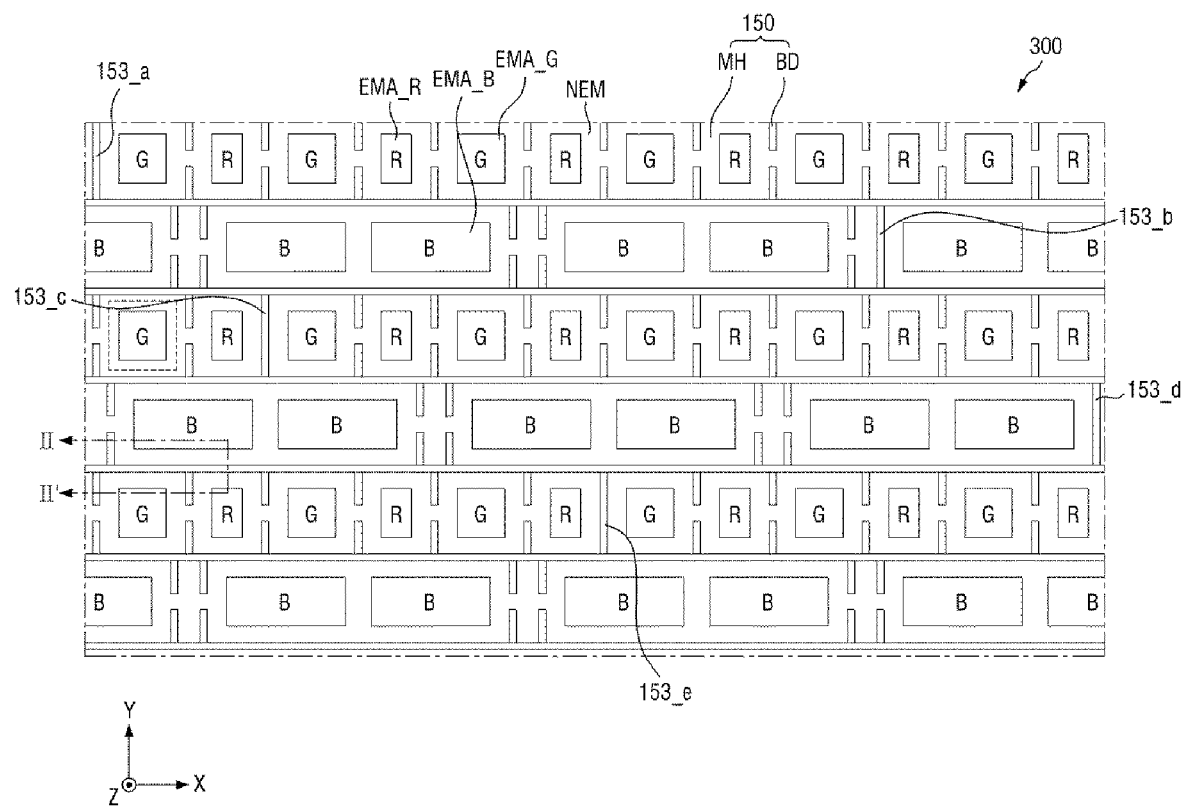
FIG. 8 is a view schematically showing an arrangement relationship between pixels of a display panel and a sensor unit according to some exemplary embodiments.
Figure 9:
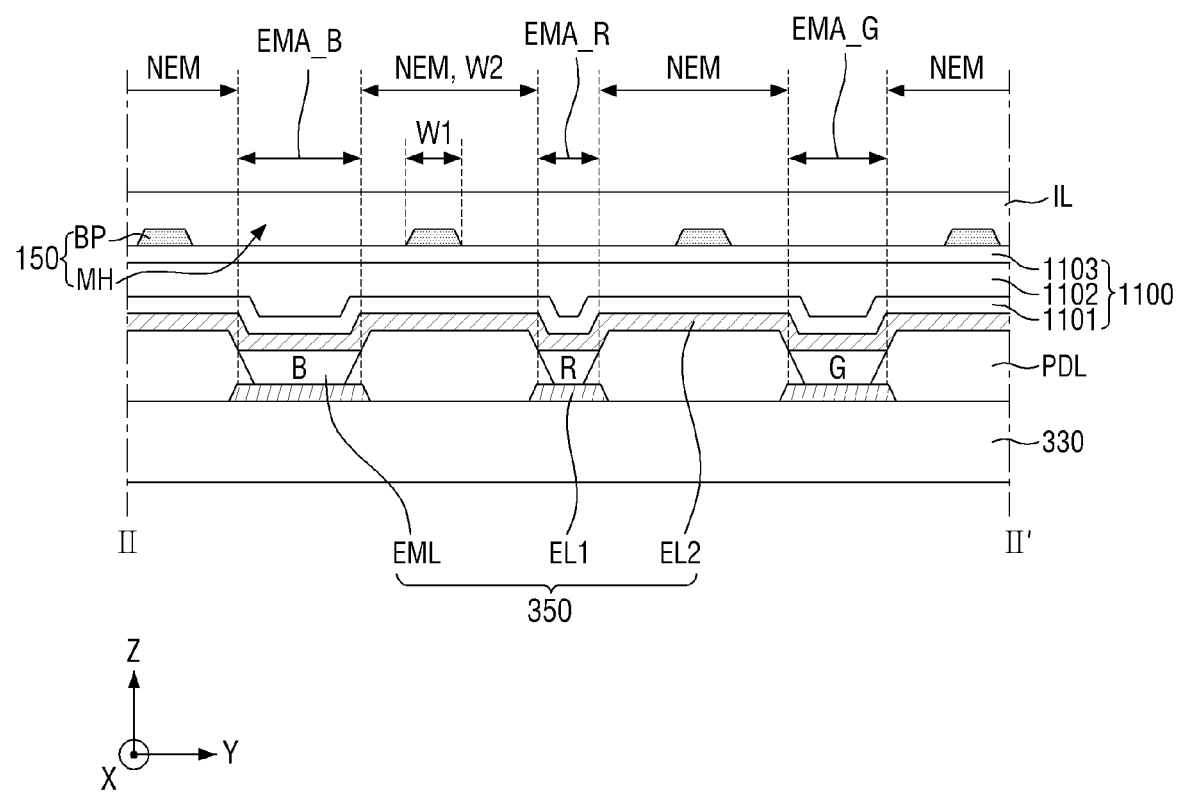
FIG. 9 is a cross-sectional view taken along sectional line II-II' of FIG. 8 according to some exemplary embodiments.

FIG. 8 is a view schematically showing an arrangement relationship between pixels of a display panel and a sensor unit according to some exemplary embodiments. FIG. 9 is a cross-sectional view taken along sectional line II-IF of FIG. 8 according to some exemplary embodiments.

FIG. 8 exemplifies an area in which the strain gauges 150 and insulating layer IL of FIG. 4 may overlap each other in a plan view. Even in the case of the electrode units 120, second lines LL and first and second signal lines SL1 and SL2 constituting a mesh structure, the arrangement relationship with the pixels of the display panel 300 may be the same.

Referring to FIGS. 6, 8, and 9, the display panel 300 may include a plurality of pixels P. Each of the pixels P may include a light emitting area EMA, which may include light emitting areas EMA_B, EMA_R, and EMA_G, and a non-light emitting area NEM. For descriptive convenience, the light emitting areas EMA_R, EMA, G, and EMA_B may be collectively referred to as a light emitting area EMA when describing general features.

The pixel P may include first color pixels, second color pixels, and third color pixels. The respective color pixels may be arranged in various manners. In some exemplary embodiments, the first color pixels (for example, red pixels) and the second color pixels (for example, green pixels) may be disposed (or arranged) alternately in the first row along the first direction (X-axis direction), and the third color pixels (for example, blue colors) may be disposed (or arranged) in the second row adjacent to the first row along the first direction (X-axis direction). The third color pixels belonging to the second row may be disposed (or arranged) to face the first and second color pixels belonging to the first row. The number of the third color pixels belonging to the second row may be twice the number of the first color pixel or second color pixel belonging to the first row. The arrangement of the first row and the second row may be repeated along the first direction (X-axis direction).

The sizes of the light emitting areas EMA in the respective color pixels P may be different from each other. For example, the light emitting area EMA_G of the second color pixel may be larger than the light emitting area EMA_R of the first color pixel, and the light emitting area EMA_B of the third color pixel may be larger than the light emitting area EMA_B of the second color pixel.

The shape of the light emitting area EMA of each color pixel P may be substantially rectangular. However, the exemplary embodiments are not limited thereto, and each light emitting area EMA may have a circular (or generally circular) shape, a rhombic (or generally rhombic) shape, other polygonal (or generally polygonal) shapes, or a polygonal (or generally polygonal) shape having generally rounded corners.

The strain gauges 150 may be divided into a mesh hole MH and a body portion BD. The mesh hole MH may overlap the light emitting area EMA in the third direction (Z-axis direction), and the area of the mesh hole MH may be greater than the area of the light emitting area EMA. The body portion BD may overlap the non-light emitting area NEM in the third direction (Z-axis direction), and, as shown in FIG. 9, the width W1 of the body portion BP may be smaller than the width W2 of the non-light emitting area NEM. With such a structure, light output from the light emitting area EMA of the display panel 300 may be effectively transmitted through the electrode units 120.

The strain gauges 150 may be constituted by connecting physically and electrically disconnected body portions BP. For instance, the first row and second row of the strain gauge 150 may be connected by a first connecting line 153_a, the second row and third row of the strain gauge 150 may be connected by a second connecting line 153_b, the third row and fourth row of the strain gauge 150 may be connected by a third connecting line 153_c, the fourth row and fifth row of the strain gauge 150 may be connected by a fourth connecting line 153_d, and the fifth row and sixth row of the strain gauge 150 may be connected by a fifth connecting line 153_e. The body portion BP between the first connection line 153_a and the second connection line 153_b may correspond to the resistance line 151, and the other body portion BP may correspond to the branch 152. When the resistance line 151 is connected to the connection line 153, the strain gauge 150 may have a loop shape in which one side is opened in a plan view.

Referring to FIG. 9, a first electrode EL1 may be disposed on the base substrate 330 for each pixel. A pixel defining layer PDL exposing the first electrode EL1 may be disposed on the first electrode EL1. The pixel defining layer PDL may be disposed in the non-light emitting area NEM.

A light emitting layer EML may be disposed on the first electrode EL1 exposed by the pixel defining layer PDL, and a second electrode EL2 may be disposed on the light emitting layer EML. The second electrode EL2 may be disposed over the entire surface without distinction between the pixels P. The first electrode EL1, the light emitting layer EML, and the second electrode EL2 constitute a light emitting element 350. A thin film encapsulation layer 1100 including a first inorganic film 1101, an organic film 1102, and a second inorganic film 1103 may be disposed on the second electrode EL2, and the body portion BD of the strain gauge and the insulating layer IL may be sequentially disposed on the thin film encapsulation layer 1100.

Figure 10:
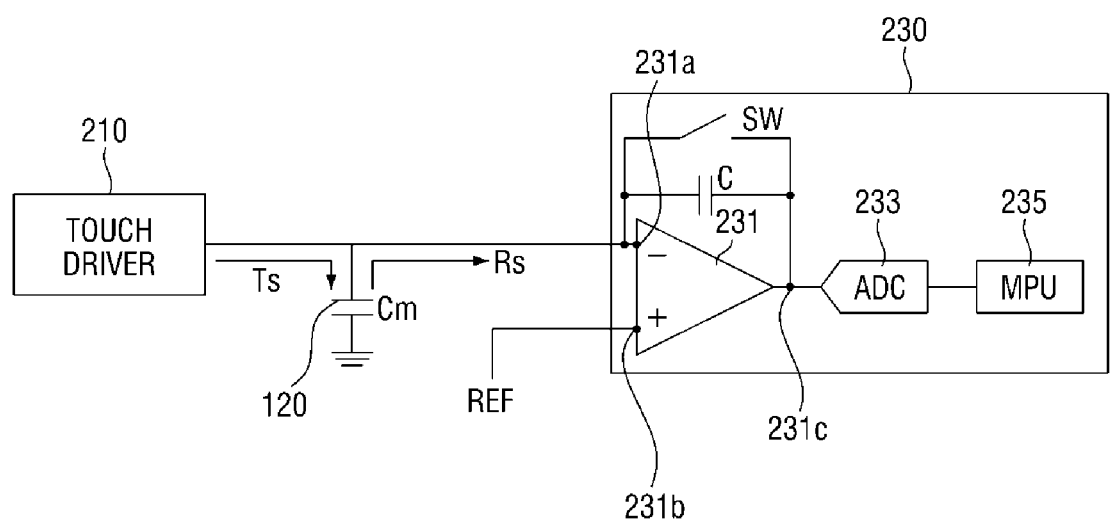
FIG. 10 is a circuit diagram for explaining a touch position detecting operation of a touch sensor according to some exemplary embodiments.

The body portion BP may be disposed to overlap the pixel defining layer PDL, and may be located in the non-light emitting area NEM. For instance, as the body portion BP does not overlap the light emitting area EMA, light emission may not be inhibited. FIG. 10 is a circuit diagram for explaining a touch position detecting operation of a touch sensor according to some exemplary embodiments.

Referring to FIGS. 4 and 10, the touch driver 210 may provide a driving signal Ts to the electrode units 120 through the second lines LL, and the touch detector 230 may receive a sensing signal Rs from the electrode units 120 through the second lines LL. As described above, the sensing signal Rs may include information on the amount of change in self-capacitance Cm.

The touch detector 230 may include at least one first amplification circuit 231 such as an operational amplifier, an analog-to-digital converter (ADC) 233, and a processor 235.

The first amplification circuit 231 may include a first input terminal 231a, a second input terminal 231b, and an output terminal 231c. According to some embodiments, the first input terminal 231a of the first amplification circuit 231, for example, an inverting input terminal of OP amp, may be electrically connected to the electrode units 120 through the second lines LL or the like, and the sensing signal Rs may be input to the first input terminal 231a.

The second input terminal 231b of the first amplification circuit 231, for example, a non-inverting input terminal of OP amp, as a reference potential terminal, may be connected to a reference power source REF. In some exemplary embodiments, the reference power source may be a ground (GND) power source. However, the exemplary embodiments are not limited thereto. When the sensor unit 100 includes a noise sensing electrode unit, the second input terminal 231b may be electrically to the noise sensing electrode unit.

When the sensor unit 100 includes a noise sensing electrode unit, the touch sensor TSM can effectively cancel a noise signal input from the display panel 300 or the like, and can improve a signal to noise ratio (SNR). For instance, the malfunction of the touch sensor TSM according to the noise signal can be minimized, and the sensing sensitivity of the touch sensor TSM can be improved.

In some exemplary embodiments, a capacitor C and a reset switch SW may be connected in parallel to each other between the first input terminal 231a and output terminal 231c of the first amplification circuit 231.

Although it is described in the aforementioned embodiments that the first amplification circuit 231 can be in the form of an inverting amplification circuit, the exemplary embodiments are not limited thereto. In some embodiments, the first amplification circuit 231 may be in the form of a non-inverting amplification circuit.

The output terminal 231c of the first amplification circuit 231 may be electrically connected to the analog to digital converter 233.

The analog to digital converter 233 may convert the input analog signal into a digital signal. According to some embodiments, the analog to digital converter 233 may be provided as many as the number of the electrode units 120 so as to correspond to each of the electrode units 120 in a 1:1 ratio. Alternatively, according to some embodiments, the respective electrode units 120 may be configured to share one analog to digital converter 233, and in this case, a switching circuit for channel selection may be additionally provided.

The processor 235 may process the converted signal (digital signal) from the analog to digital converter 233, and may detect a touch input according to the signal processing result. For example, the processor 235 may comprehensively analyze the sensing signal amplified by the first amplification circuit 231 and converted by the analog-to-digital converter 233 to detect the occurrence of a touch input and the position of the touch input. According to some embodiments, the processor 235 may be realized as a microprocessor MPU. In this case, a memory required for driving the processor 235 may be additionally provided in the touch detector 230. Meanwhile, the configuration of the processor 235 may not limited thereto. For instance, the processor 235 may be realized as a microcontroller MCU or the like.

Figure 11:
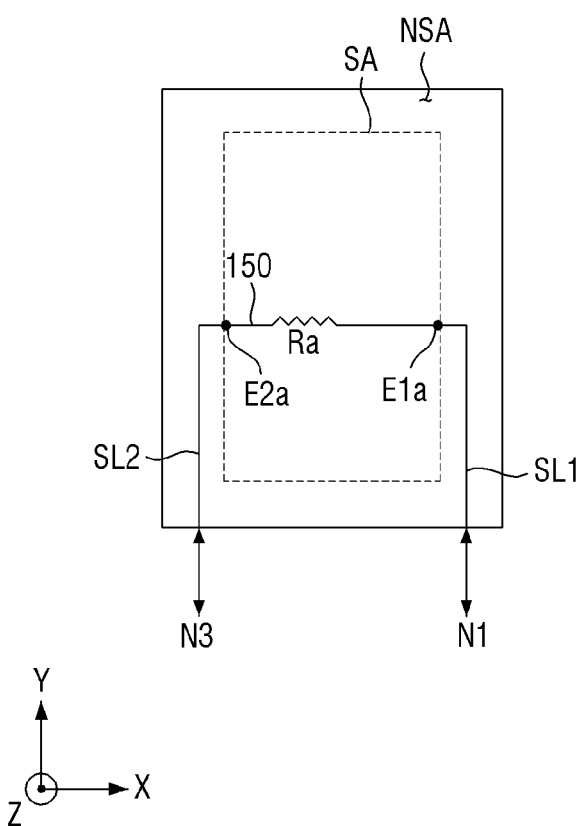
FIG. 11 is a circuit diagram showing an arrangement of a strain gauge and signal lines of a touch sensor and a connection relationship with a Wheatstone bridge circuit unit according to some exemplary embodiments.
Figure 12:
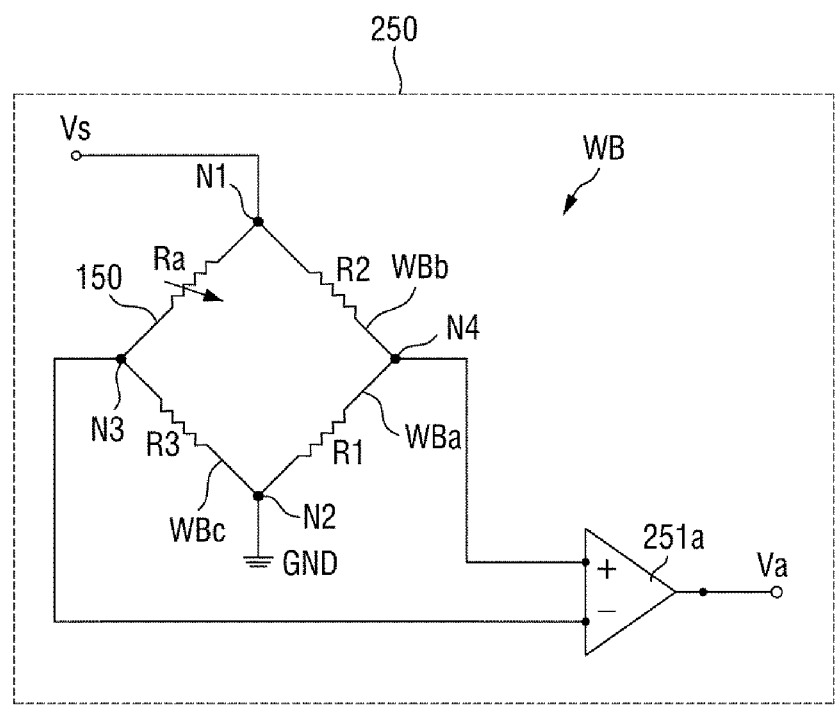
FIG. 12 is a circuit diagram showing a first pressure detector including a first Wheatstone bridge circuit unit electrically connected with a first strain gauge of a touch sensor according to some exemplary embodiments.

FIG. 11 is a circuit diagram showing an arrangement of a strain gauge and signal lines of a touch sensor and a connection relationship with a Wheatstone bridge circuit unit according to some exemplary embodiments. FIG. 12 is a circuit diagram showing a first pressure detector including a first Wheatstone bridge circuit unit electrically connected with a first strain gauge of a touch sensor according to some exemplary embodiments.

Referring to FIGS. 11 and 12, the strain gauge 150 may include one end E1a and the other end E2a located opposite to each other along the first direction (X-axis direction). As described above, one end E1a of the strain gauge 150 may be connected to the first signal line SL1, and the other end E2a of the strain gauge 150 may be connected to the second signal line SL2.

Although one exemplary strain gauge 150 is illustrated, as described above, a plurality of strain gauges 150 may be arranged on the sensing area SA. For instance, the Wheatstone bridge circuit units WB may also be individually connected as many as the number of the strain gauges 150 to be provided onto the controller 200.

Since one end E1a and the other end E2a of the strain gauge 150 are located opposite to each other, the first signal line SL1 and the second signal line SL2 may also be located opposite to each other with the sensing area SA therebetween.

The pressure detector 250 may include a Wheatstone bridge circuit unit WB. The pressure detector 250 may further include an analog to digital converter and a processor to detect a first voltage Va output from the Wheatstone bridge circuit unit WB.

The Wheatstone bridge circuit unit WB may include a first node N1, a second node N2, a first output node N3, and a second output node N4. A driving voltage Vs may be provided to the first node N1 and the second node N2 may be connected to the ground GND.

The Wheatstone bridge circuit unit WB may include a first resistor WBa connected to the second node N2 and the second output node N4, a second resistor WBb connected to the first node N1 and the second output node N4, and a third resistor WBc connected to the second node N2 and the first output node N3.

The resistance value R1 of the first resistor WBa, the resistance value R2 of the second resistor WBb, and the resistance value R3 of the third resistor WBc may have predetermined values. For instance, the first to third resistors WBa to WBc may be fixed resistors.

The Wheatstone bridge circuit unit WB may further include a second amplification circuit 251a such as an operational amplifier. The second amplification circuit 251a may include an inverting input terminal, a non-inverting input terminal, and an output terminal. The second amplification circuit 251a may detect an electrical flow between the first output node N3 and the second output node N4. For instance, the second amplification circuit 251a may operate as a galvanic element or a voltage measuring element.

Any one of the first output node N3 and the second output node N4 may be electrically connected to any one of the input terminals of the second amplification circuit 251a, and the other one of the first output node N3 and the second output node N4 may be electrically connected to the other one of the input terminals of the second amplification circuit 251a. For example, the first output node N3 may be connected to the inverting input terminal of the second amplification circuit 251a, and the second output node N4 may be connected to the non-inverting input terminal of the second amplification circuit 251a.

The output terminal of the second amplification circuit 251a may output a first voltage Va proportional to the difference between the voltage values input to the both input terminals.

One end E1a of the strain gauge 150 may be electrically connected to the first node N1 through the first signal line SL1, and the other end E2a of the strain gauge 150 may be connected to the first output node N3 through the second signal line SL2.

In some embodiments, the strain gauge 150, the first resistor WBa, the second resistor WBb, and the third resistor WBc may be connected to each other to constitute the Wheatstone bridge circuit unit WB.

In a state where a touch input is not applied, the product of the resistance value Ra of the strain gauge 150 and the resistance value R1 of the first resistor WBa may be substantially equal to the product of the resistance value R2 of the second resistor WBb and the resistance value R3 of the third resistor WBc.

For instance, when the product of the resistance value Ra of the strain gauge 150 and the resistance value R1 of the first resistor WBa is equal to the product of the resistance value R2 of the second resistor WBb and the resistance value R3 of the third resistor WBc, the voltages of the first output node N3 and the second output node N4 may be equal to each other. When the voltages of the first output node N3 and the second output node N4 are equal to each other, the voltage difference between the first output node N3 and the second output node N4 may be 0 V, and the first voltage Va output by the second amplification circuit 251a may be 0 V.

When a touch input is applied to the sensor unit 100, the shape of the strain gauge 150 is deformed in accordance with the strength of the touch, and the resistance value Ra of the strain gauge 150 can be changed by the shape deformation, so that a voltage difference is generated between the first output node N3 and the second output node N4. When a voltage difference is generated between the first output node N3 and the second output node N4, the second amplification circuit 251a outputs a value other than 0V as the first voltage Va, and the touch sensor may measure touch intensity or touch pressure by measuring this first voltage Va.

Figure 13:
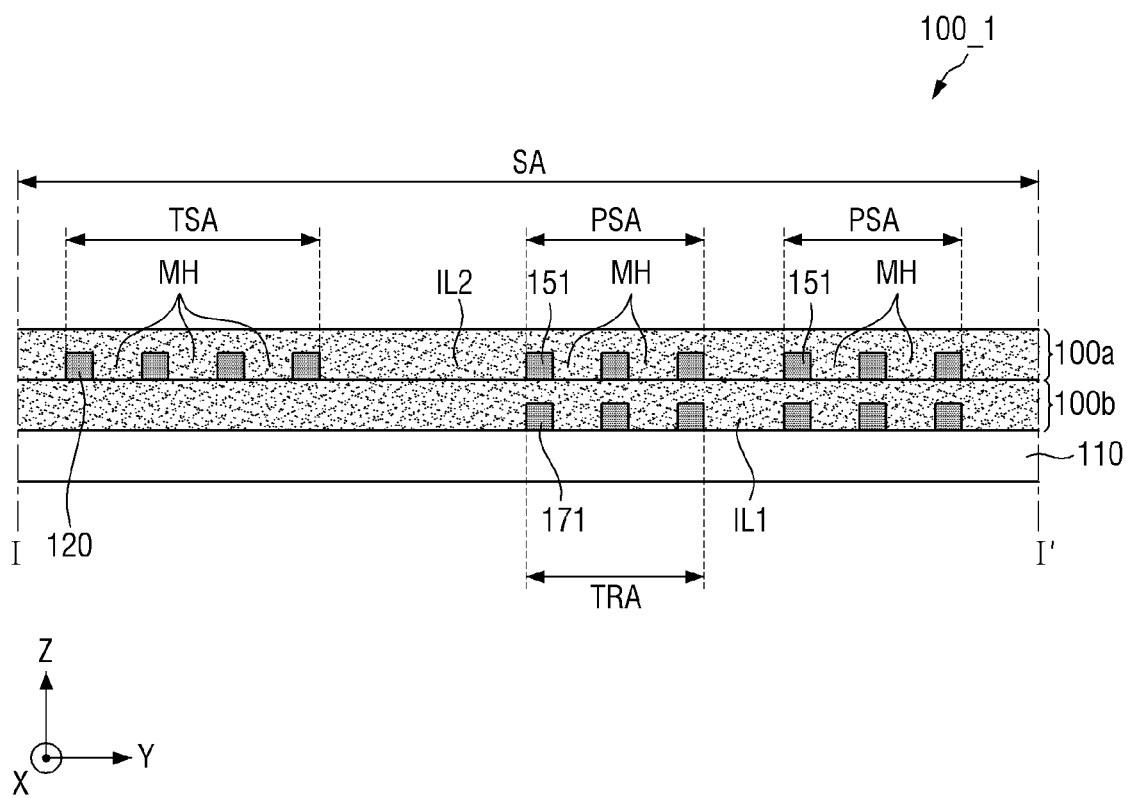
FIG. 13 is a cross-sectional view taken along sectional line I-I' of FIG. 6 according to some exemplary embodiments.
Figure 14:
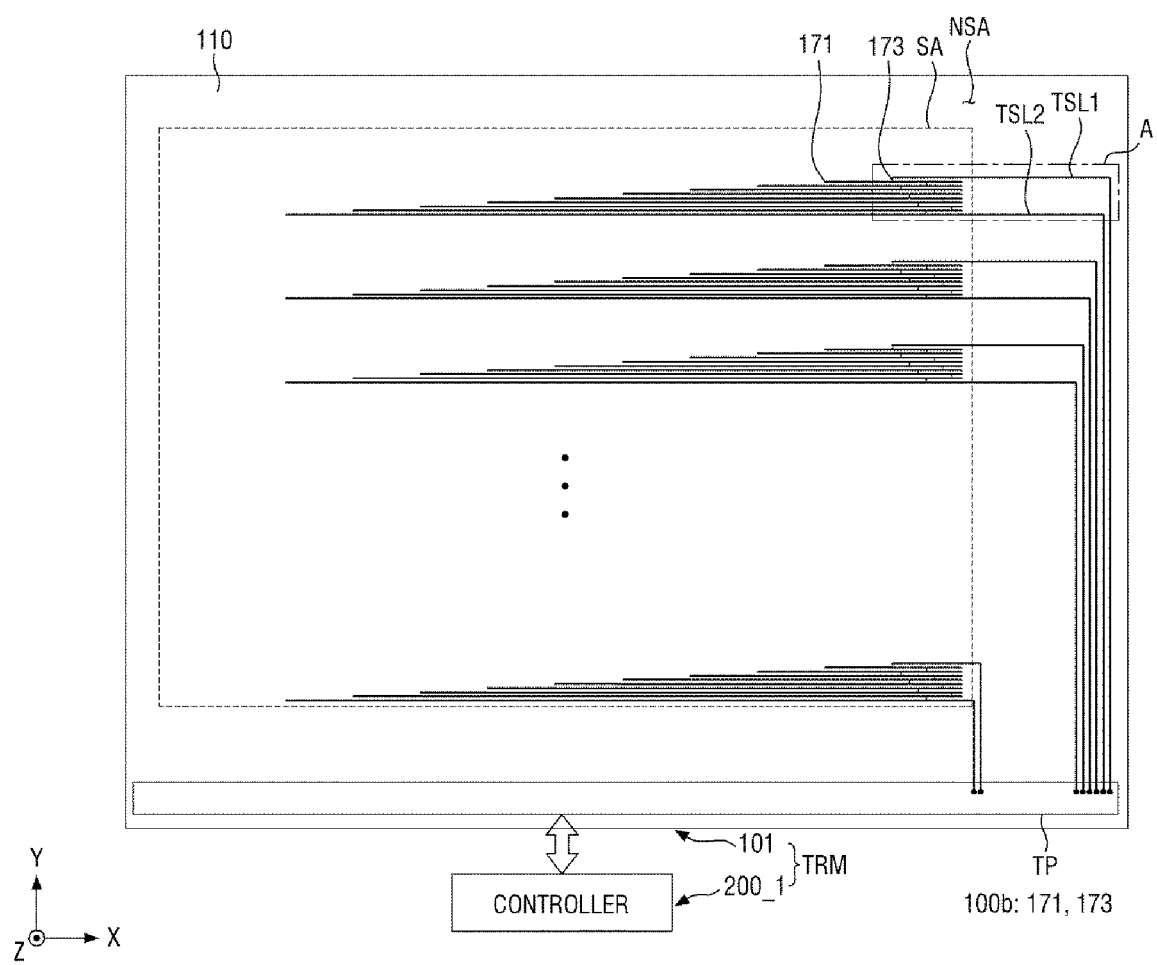
FIG. 14 is a plan view of a temperature compensation module of a touch sensor according to some exemplary embodiments.

FIG. 13 is a cross-sectional view taken along sectional line I-I' of FIG. 6 according to some exemplary embodiments. FIG. 14 is a plan view of a temperature compensation module of a touch sensor according to some exemplary embodiments.

Referring to FIGS. 13 and 14, the embodiment of FIGS. 13 and 14 can be different from the embodiment of FIGS. 1 to 12 in that a sensor unit 100_1 of the touch sensor TSM further includes a temperature compensation module TRM. A description overlapping the embodiment of FIGS. 1 to 12 will be omitted, and differences will be mainly described.

Referring to FIGS. 13 and 14, the temperature compensation module TRM may include a temperature compensator 101 and a controller 200_1. The temperature compensator 101 may be disposed so as to overlap the sensor unit ('100' in FIG. 1). The area where the temperature compensator 101 detects and compensates temperature may correspond to the sensing area SA where the sensor unit 100 can detect a touch input. Further, the temperature compensator 101 may be disposed between the display panel ('300' in FIG. 1) and the sensor unit ('100' in FIG. 1). For instance, the sensing area SA may include a touch position sensing area TSA in which the electrode units 120 are arranged, a touch pressure sensing area PSA in which the resistance line 151 is disposed, and a temperature compensation area TRA in which a temperature compensation resistance line 171 is disposed.

The temperature compensator 101 may include temperature compensation patterns 100b and first and second temperature compensation signal lines TSL1 and TSL2 connected thereto. The temperature compensation patterns 100b and the first and second temperature compensation signal lines TSL1 and TSL2 may be arranged on the base layer 110, and may have a mesh structure.

The temperature compensation patterns 100b may be arranged corresponding to the strain gauges 150 of FIG. 4. For example, the temperature compensation patterns 100b may overlap the strain gauges 150 in the third direction (Z-axis direction).

The temperature compensation patterns 100b may include a temperature compensation resistance line 171 and a temperature compensation connection line 173.

The temperature compensation resistance line 171 may have the same shape as the resistance line 151 of the strain gauge 150. For example, the temperature compensation resistance line 171 may be bent to have a predetermined pattern corresponding to the resistance line 151 of the strain gauge 150. However, the exemplary embodiments are not limited thereto, and the shape of the temperature compensation resistance line 171 may be different from that of the resistance line 151 of the strain gauge 150. Even when the shape of the temperature compensation resistance line 171 is different from that of the resistance line 151 of the strain gauge 150, the resistance value of the temperature compensation resistance line 171 may be equal to the resistance value of the resistance line 151. The temperature compensation connection line 173 may electrically connect the temperature compensation resistance lines 171 disposed along the second direction (Y-axis direction) to each other.

A first insulating layer IL1 may be disposed on the first temperature compensation patterns 100b, and the sensing pattern (100a' in FIG. 4) of the sensor unit ('100' in FIG. 1) may be disposed on the first insulating layer IL1. The first insulating layer IL1 may be embodied as a multilayer including at least one organic film and at least one inorganic film, or may be embodied as a single layer including a combination of organic and inorganic materials.

The first temperature compensation signal line TSL1 may be connected to one end of the temperature compensation pattern 100b and the second temperature compensation signal line TSL2 may be connected to the other end of the temperature compensation pattern 100b.

The first and second temperature compensation signal lines TSL1 and TSL2 may be connected to the pad unit TP to transmit a signal to the controller 200_1.

Referring to FIGS. 1 to 6 together, when a user's touch input is applied to the touch sensor TSM, the resistance value of the strain gauge 150 may be changed according to the intensity of a touch input. Further, the resistance value of the strain gauge 150 may be changed according to the body temperature of the user or the temperature change caused by the underlying display panel 300. Accordingly, the portion of the change amount of the resistance value of the first strain gauge 150 based on the temperature change may be independent of the intensity of a user's touch input, and thus may act as noise.

In the case of this embodiment, the temperature compensation patterns 100b are disposed to overlap the lower portion corresponding to the strain gauge 150. When a user's touch input is applied to the touch sensor TSM, the resistance value of the strain gauge 150 may be changed according to the body temperature of the user or the temperature change caused by the underlying display panel 300, and the resistance values of the temperature compensation patterns 100b may be changed according to the body temperature of the user or the transmission of heat by the underlying display panel 300. The component based on the temperature change in the change amount of the resistance value of the strain gauge 150 may be compensated using the change of resistance value occurring based on the temperature change.

Figure 15:
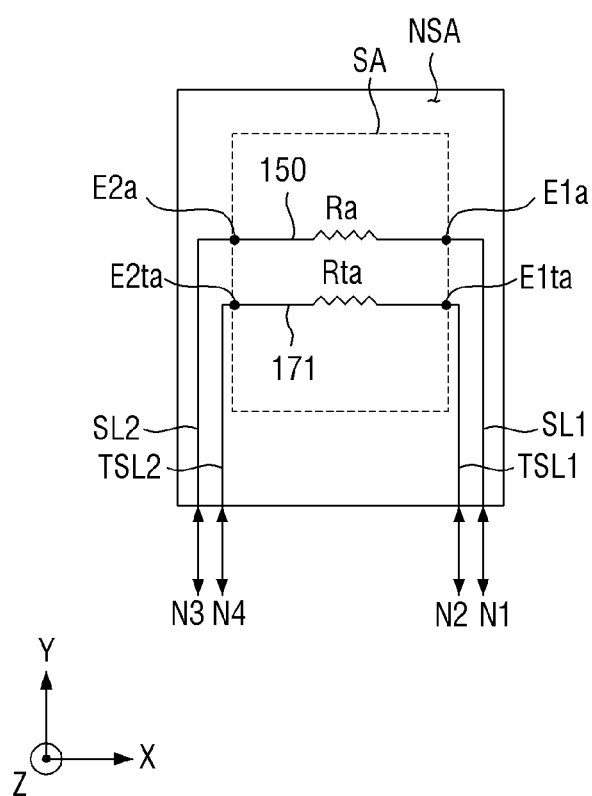
FIG. 15 is a circuit diagram showing an arrangement of a strain gauge, a temperature compensation pattern, and signal lines of a touch sensor and a connection relationship with a Wheatstone bridge circuit unit according to some exemplary embodiments.
Figure 16:
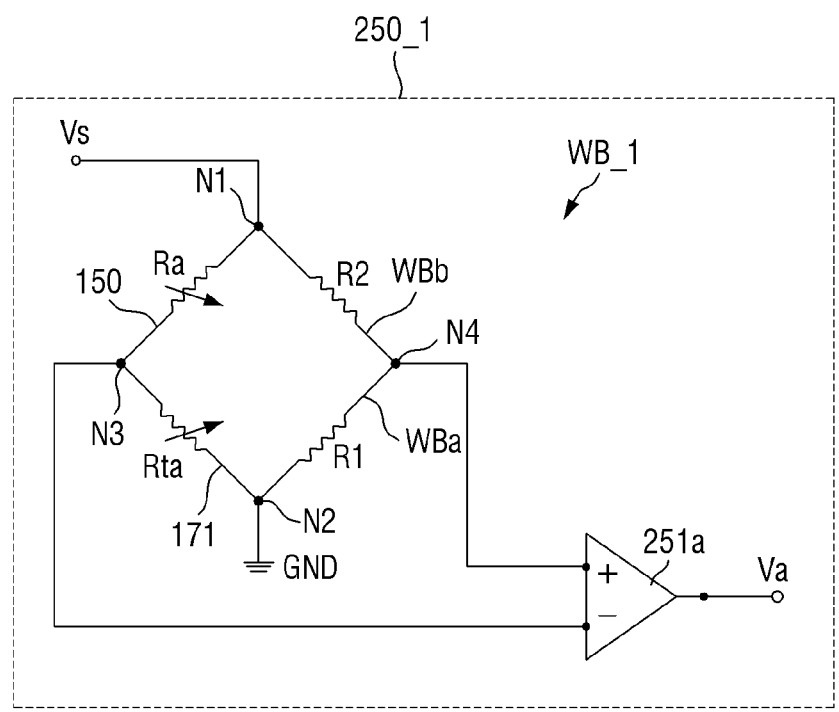
FIG. 16 is a circuit diagram showing a first Wheatstone bridge circuit unit electrically connected with a first strain gauge and a temperature compensation pattern of a touch sensor according to some exemplary embodiments.

FIG. 15 is a circuit diagram showing an arrangement of a strain gauge, a temperature compensation pattern, and signal lines of a touch sensor and a connection relationship with a Wheatstone bridge circuit unit according to some exemplary embodiments. FIG. 16 is a circuit diagram showing a first Wheatstone bridge circuit unit electrically connected with a first strain gauge and a temperature compensation pattern of a touch sensor according to some exemplary embodiments. The embodiment of FIGS. 15 and 16 can be different from the embodiment of FIGS. 11 and 12 when a Wheatstone bridge circuit unit WB_1 of a pressure detector 250_1 includes temperature compensation patterns 100b. A description overlapping the embodiment of FIGS. 11 and 12 will be omitted, and only differences will be primarily described hereinafter.

One end E1a of the strain gauge 150 may be electrically connected to the first node N1 through the first signal line SL1, and the other end E2a of the strain gauge 150 may be connected to the first output node N3 through the second signal line SL2.

One ends E1ta of the first temperature compensation patterns 100b may be connected to the second node N2 through the first temperature compensation signal line TSL1, and the other ends E2ta of the first temperature compensation patterns 100b may be connected to the first output node N3 through the second temperature compensation signal line TSL2. The strain gauge 150, the temperature compensation patterns 100b, the first resistor WBa, and the second resistor WBb may be connected to each other to form a Wheatstone bridge.

In some exemplary embodiments, in a state where a touch input is not applied, the product of the resistance value Ra of the strain gauge 150 and the resistance value R1 of the first resistor WBa may be substantially equal to the product of the resistance value Rta of the temperature compensation patterns 100b and the resistance value R2 of the second resistor WBb.

When a touch input is applied, the resistance value Ra of the strain gauge 150 may include a component that changes in shape depending on touch pressure (hereinafter, referred to as a 'first pressure resistance component') and a component that can change based on a temperature change (hereinafter, referred to as a 'first temperature resistance component'). Further, when a touch input is applied, the resistance value Rta of the temperature compensation patterns 100b may include a component that changes in shape depending on touch pressure (hereinafter, referred to as a 'second pressure resistance component') and a component that may change based on a temperature change (hereinafter, referred to as a 'second temperature resistance component'). The second pressure resistance component may be negligible, or may be significantly different from the first pressure resistance component. Since the strain gauge 150 and the temperature compensation patterns 100b are not arranged to face each other in a diagonal direction from the Wheatstone bridge circuit portion, the second temperature resistance component of the temperature compensation patterns 100b may compensate or offset the first temperature resistance component of the strain gauge 150, and thus a touch pressure may be more sensitively detected.

According to some exemplary embodiments, a touch sensor which can simplify a process and improve production efficiency by realizing a single-layered sensing pattern capable of sensing the pressure of a touch input and the position of a touch input, and a display device including the touch sensor can be provided.

Further, according to some exemplary embodiments, it is possible to reduce the visibility of the shape of the wiring patterns of the touch sensor and the pressure sensor by changing the wiring structures of the touch sensor and the pressure sensor.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A touch sensor, comprising:
   a base layer;
   electrode units disposed on the base layer, the electrode units being arranged in a first direction and a second direction crossing the first direction; and loop-shaped first lines in a same layer as the electrode units, the loop-shaped first lines being disposed between some of the electrode units, which are adjacent in the second direction, wherein:

the loop-shaped first lines comprise resistance lines extending in the first direction and connection lines extending in the second direction;

some of the resistance lines, which are adjacent in the second direction, are connected by a connection line among the connection lines;

the connection lines are spaced apart from each other in the first direction; and the resistance lines adjacent in the second direction have different lengths.

2. The touch sensor of claim 1, wherein the extension direction of the connection lines is different from the arrangement direction of the connection lines.

3. The touch sensor of claim 1, wherein:

each of the electrode units has an island shape; and the loop-shaped first lines are spaced apart from the electrode units.

4. The touch sensor of claim 1, further comprising:

a pad unit comprising pads;

second lines electrically connecting first ends of the electrode units to the pad unit;

a first signal line electrically connecting first ends of the loop-shaped first lines to the pad unit; and a second signal line electrically connecting second ends of the loop-shaped first lines to the pad unit.

5. The touch sensor of claim 4, wherein each of the second lines comprises:

one or more first portions extending in the first direction; and one or more second portions connected to at least one of the one or more first portions to form a bent portion, the one or more second portions extending in the second direction.

6. The touch sensor of claim 5, wherein the bent portions are arranged in correspondence with one another.

7. The touch sensor of claim 5, wherein each electrode unit among the electrode units is directly connected to a second portion among the one or more second portions of a corresponding second line.

8. The touch sensor of claim 7, wherein the resistance lines comprise branch lines extending from respective connections between the connection lines and the resistance lines.

9. The touch sensor of claim 4, wherein:

a first resistance line among the resistance lines is connected to the first signal line; and a second resistance line among the resistance lines is connected to the second signal line.

10. The touch sensor of claim 1, wherein the loop-shaped first lines form strain gauges, the strain gauges comprising mesh holes and body portions.

11. A display device, comprising:

a pixel defining layer comprising openings corresponding to light emitting areas, each light emitting area among the light emitting areas comprising:

a first electrode at least partially exposed by an opening among the openings;

a light emitting layer disposed on the first electrode in the opening; and a second electrode overlapping the first electrode, the light emitting layer being disposed between the second electrode and the first electrode;

a thin film encapsulation layer disposed on the pixel defining layer;

electrode units disposed on the thin film encapsulation layer, the electrode units being arranged in a first direction and a second direction crossing the first direction; and a loop-shaped first line in a same layer as the electrode units, the loop-shaped first line being disposed between some of the electrode units, which are adjacent in the second direction;

wherein:

the loop-shaped first line comprises resistance lines extending in the first direction and connection lines extending in the second direction;

the resistance lines are connected together by the connection lines;

the connection lines are spaced apart from each other in the first direction by a light emitting area among the light emitting areas; and the resistance lines adjacent in the second direction have different lengths.

12. The display device of claim 11, wherein the extension direction of the connection lines is different from the arrangement direction of the connection lines.

13. The display device of claim 11, wherein, in a plan view, the electrode units and the loop-shaped first line overlap the pixel defining layer and are spaced apart from the openings.

14. The display device of claim 11, further comprising:

a pad unit comprising pads;

second lines electrically connecting first ends of the electrode units to the pad unit;

a first signal line electrically connecting a first end of the loop-shaped first line to the pad unit; and a second signal line electrically connecting a second end of the loop-shaped first line to the pad unit.

15. The display device of claim 14, wherein each of the second lines comprises:

one or more first portions extending in the first direction; and one or more second portions connected to at least one of the one or more first portions to form a bent portion, the one or more second portions extending in the second direction.

16. The display device of claim 11, wherein, in response to a touch input, the display device is configured to:

detect a position of the touch input based on a change in self-capacitance between the first and second electrodes; and detect a pressure of the touch input based on a change in resistance of the loop-shaped first line.

17. The display device of claim 11, further comprising:

a temperature compensator disposed between the thin film encapsulation layer and the loop-shaped first lines, wherein the temperature compensator comprises temperature compensation resistance lines, the temperature compensation resistance lines overlapping the resistance lines in a third direction perpendicular to each of the first direction and the second direction.

18. The display device of claim 17, further comprising:

an insulating layer disposed between a temperature compensation resistance line among the temperature compensation resistance lines and a resistance line among the resistance lines, wherein a shape of the temperature compensation resistance line is substantially equivalent to a shape of the resistance line.

19. The display device of claim 18, further comprising:
a Wheatstone bridge circuit unit electrically connected to the loop-shaped first line,
wherein the Wheatstone bridge circuit comprises:
a first node configured to receive a driving voltage;
a second node connected to a ground;
a first output node; and
a second output node,
wherein a first end of the loop-shaped first line is electrically connected to the first node, and
wherein a second end of the loop-shaped first line is electrically connected to the first output node.

20. The display device of claim 19, wherein, when a touch input is not applied, a resistance value of the temperature compensation resistance line is substantially equal to a resistance value of the loop-shaped first line.

21. The display device of claim 11, wherein the loop-shaped first line forms a strain gauge, the strain gauge comprising a mesh hole and a body portion.

\* \* \* \* \*